United States Patent
Mou et al.

(10) Patent No.: US 12,010,919 B2
(45) Date of Patent: Jun. 11, 2024

(54) HETEROGENEOUS INTEGRATION CHIP OF MICRO FLUID ACTUATOR

(71) Applicant: Microjet Technology Co., Ltd., Hsinchu (TW)

(72) Inventors: Hao-Jan Mou, Hsinchu (TW); Hsien-Chung Tai, Hsinchu (TW); Lin-Huei Fang, Hsinchu (TW); Yung-Lung Han, Hsinchu (TW); Chi-Feng Huang, Hsinchu (TW); Chun-Yi Kuo, Hsinchu (TW); Tsung-I Lin, Hsinchu (TW); Chin-Wen Hsieh, Hsinchu (TW)

(73) Assignee: MICROJET TECHNOLOGY CO., LTD., Hsinchu (TW)

( * ) Notice: Subject to any disclaimer, the term of this patent is extended or adjusted under 35 U.S.C. 154(b) by 643 days.

(21) Appl. No.: 17/241,506

(22) Filed: Apr. 27, 2021

(65) Prior Publication Data
US 2021/0343924 A1   Nov. 4, 2021

(30) Foreign Application Priority Data

Apr. 30, 2020  (TW) ................. 109114566

(51) Int. Cl.
  *H01L 41/04*  (2006.01)
  *B81B 3/00*  (2006.01)
  (Continued)

(52) U.S. Cl.
  CPC ......... *H10N 30/802* (2023.02); *B81B 3/0021* (2013.01); *H10N 30/2047* (2023.02); *B81B 2201/036* (2013.01)

(58) Field of Classification Search
  CPC .................. H10N 30/802; H01N 30/2047
  See application file for complete search history.

(56) References Cited

U.S. PATENT DOCUMENTS

| 2003/0143122 A1* | 7/2003 | Sander | F16K 99/0015 422/503 |
| 2020/0166155 A1* | 5/2020 | Mou | F16K 99/0048 |
| 2020/0224791 A1* | 7/2020 | Mou | F04B 43/046 |

FOREIGN PATENT DOCUMENTS

| CN | 1915668 A | 2/2007 |
| CN | 110114221 A | 8/2010 |

(Continued)

*Primary Examiner* — Bryan P Gordon
(74) *Attorney, Agent, or Firm* — Birch, Stewart, Kolasch & Birch, LLP

(57) ABSTRACT

A heterogeneous integration chip of a micro fluid actuator is disclosed and includes a first substrate, a first insulation layer, a first conductive layer, a piezoelectric layer, a second conductive layer, a second substrate, a control element, a perforated trench and a conductor. The first substrate includes a first chamber. The first insulation layer is disposed on the first substrate. The first conductive layer is disposed on the first insulation layer and includes an electrode pad. The piezoelectric layer and the second conductive layer are stacked on the first conductive layer sequentially. The second substrate is assembled to the first substrate through a bonding layer to define a second chamber and includes an orifice, a fluid flowing channel and a third chamber. The control element is disposed in the second substrate. The perforated trench filled with the conductor is penetrated from the electrode pad to the second substrate.

14 Claims, 22 Drawing Sheets

(51) Int. Cl.
*H10N 30/20* (2023.01)
*H10N 30/80* (2023.01)

(56) References Cited

FOREIGN PATENT DOCUMENTS

| | | |
|---|---|---|
| CN | 105280620 A | 1/2016 |
| CN | 105966069 A | 9/2016 |
| CN | 207483357 U | 6/2018 |
| CN | 209940465 U | 1/2020 |

\* cited by examiner

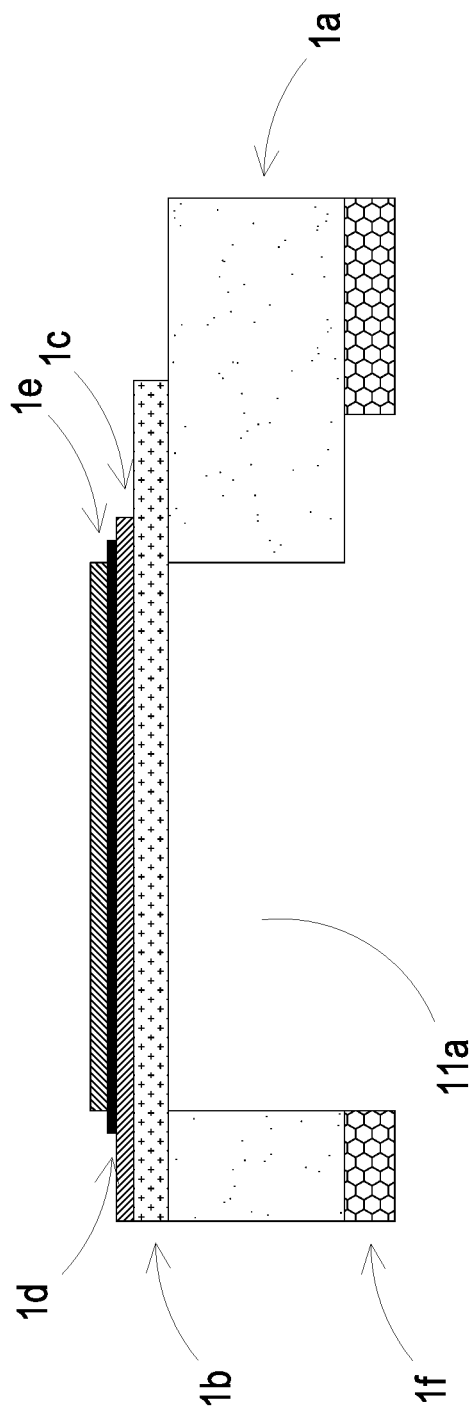

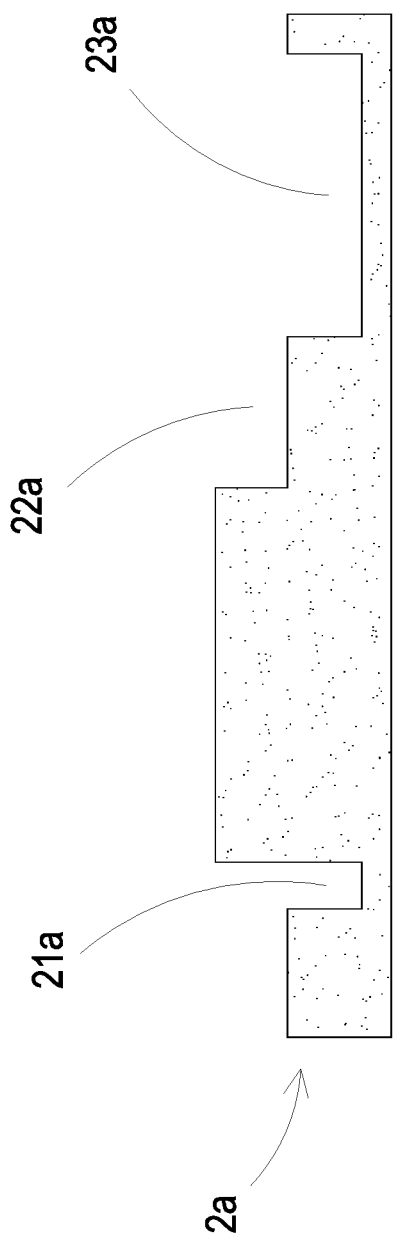

HETEROGENEOUS INTEGRATION CHIP OF MICRO FLUID ACTUATOR

FIELD OF THE INVENTION

The present disclosure relates to an integration chip, and more particularly to a heterogeneous integration chip of a micro fluid actuator manufactured by a micro-electromechanical semiconductor process.

BACKGROUND OF THE INVENTION

Currently, in the products used in various technical fields, such as pharmaceutical industries, computer techniques, printing industries or energy industries, are developed toward elaboration and miniaturization. The fluid transportation devices are important components used in, for example, micro pumps, micro atomizers, printheads or the industrial printers.

With the rapid advancement of science and technology, the application of fluid transportation device tends to be more and more diversified in the industrial applications, the biomedical applications, the healthcare, the electronic cooling and so on, even the most popular wearable devices. The conventional fluid actuators gradually tend to miniaturize the structure and maximize the flow rate thereof.

A variety of micro fluid actuators manufactured by microelectromechanical semiconductor processes have been developed in the prior art. However, the bottleneck of integrating the main body and the control elements (such as the microcontrollers and the control circuits) in the micro fluid actuator is not broken through. Therefore, how to integrating the main body and the control elements in the micro fluid actuator is an important subject developed in the present disclosure.

SUMMARY OF THE INVENTION

An object of the present disclosure is to provide a heterogeneous integration chip of a micro fluid actuator. With through-silicon-via (TSV) packaging technology, the heterogeneous integration chip of the micro fluid actuator is coupled with a MOS circuit IC or a microcontroller made by semiconductor process.

In accordance with an aspect of the present disclosure, a heterogeneous integration chip of a micro fluid actuator including a first substrate, a first insulation layer, a first conductive layer, a piezoelectric layer, a second conductive layer, a second substrate, a bonding layer, a control element, at least one perforated trench and at least one conductor is provided. The first substrate includes a first chamber. The first insulation layer is disposed on the first substrate. The first conductive layer is disposed on the first insulation layer and includes at least one electrode pad. The piezoelectric layer is disposed on the first conductive layer. The second conductive layer is disposed on the piezoelectric layer. The second substrate is assembled to the first substrate to define a second chamber and includes an orifice, a fluid flowing channel and a third chamber. The bonding layer is connected between the first substrate and the second substrate. The control element is disposed in the second substrate. The at least one perforated trench is penetrated from the at least one electrode pad to the second substrate. The at least one conductor is filled in the at least one perforated trench.

In accordance with another aspect of the present disclosure, a heterogeneous integration chip of a micro fluid actuator including a first substrate, a first insulation layer, a first conductive layer, a piezoelectric layer, a second conductive layer, a second substrate, a control element, at least one perforated trench and at least one conductor is provided. The first substrate includes at least one first chamber. The first insulation layer is disposed on the first substrate. The first conductive layer is disposed on the first insulation layer and includes at least one electrode pad. The piezoelectric layer is disposed on the first conductive layer. The second conductive layer is disposed on the piezoelectric layer. At least one actuation region is defined by the first conductive layer, the piezoelectric layer and the second conductive layer collaboratively. The second substrate is assembled to the first substrate to define at least one second chamber and includes at least one orifice, at least one fluid flowing channel and at least one third chamber. The positions of the at least one first chamber of the first substrate, the at least one second chamber, the at least one orifice, the at least one fluid flowing channel and the at least one third chamber are corresponding to the at least one actuation region. The control element is disposed in the second substrate. The at least one perforated trench penetrates from the at least one electrode pad to the second substrate. The at least one conductor is filled in the at least one perforated trench.

BRIEF DESCRIPTION OF THE DRAWINGS

The above contents of the present disclosure will become more readily apparent to those ordinarily skilled in the art after reviewing the following detailed description and accompanying drawings, in which:

FIGS. 2A to 2D and 3A to 3F show manufacturing steps of the heterogeneous integration chip of the micro fluid actuator according to the first embodiment of the present disclosure;

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
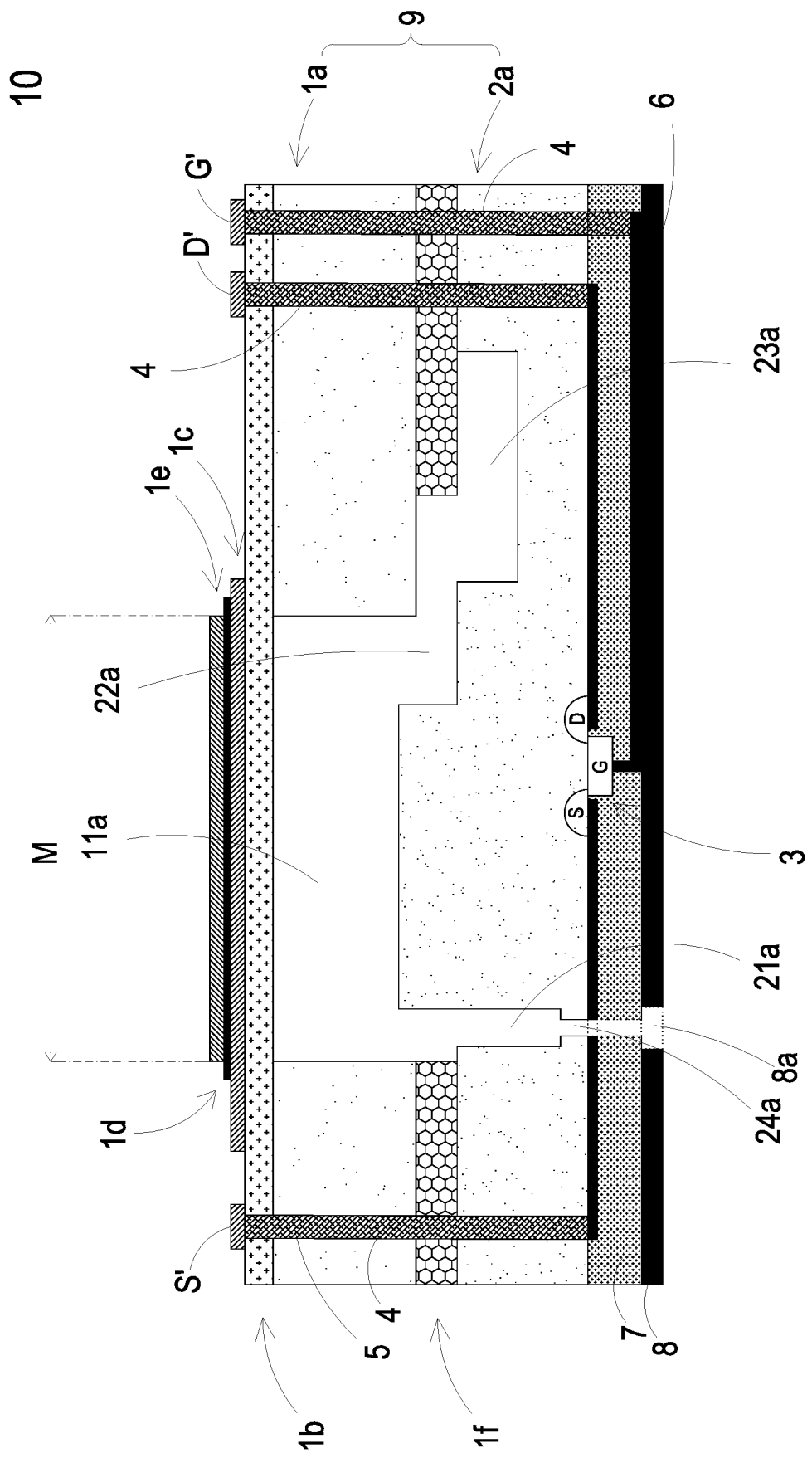
FIG. 1 is a cross sectional view illustrating a heterogeneous integration chip of a micro fluid actuator according to a first embodiment of the present disclosure.
Figure 2A:
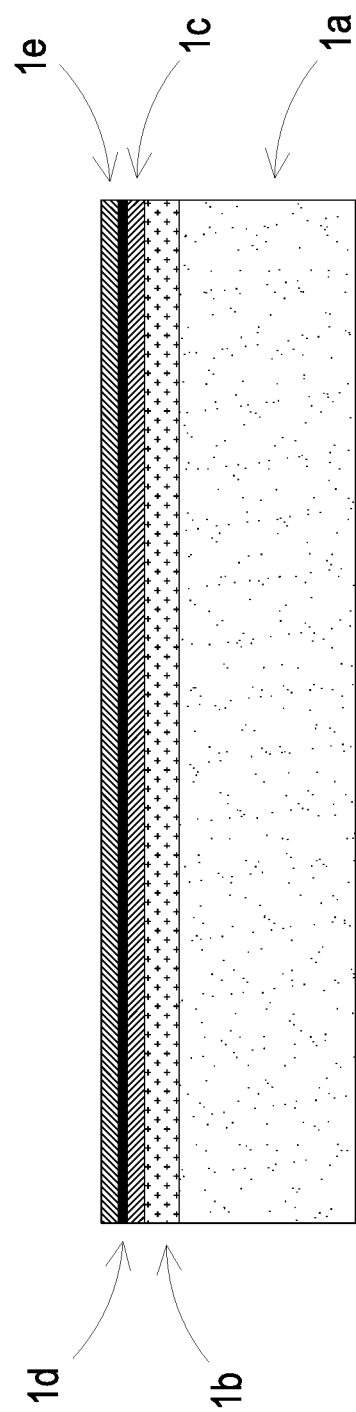
Figure 2B:
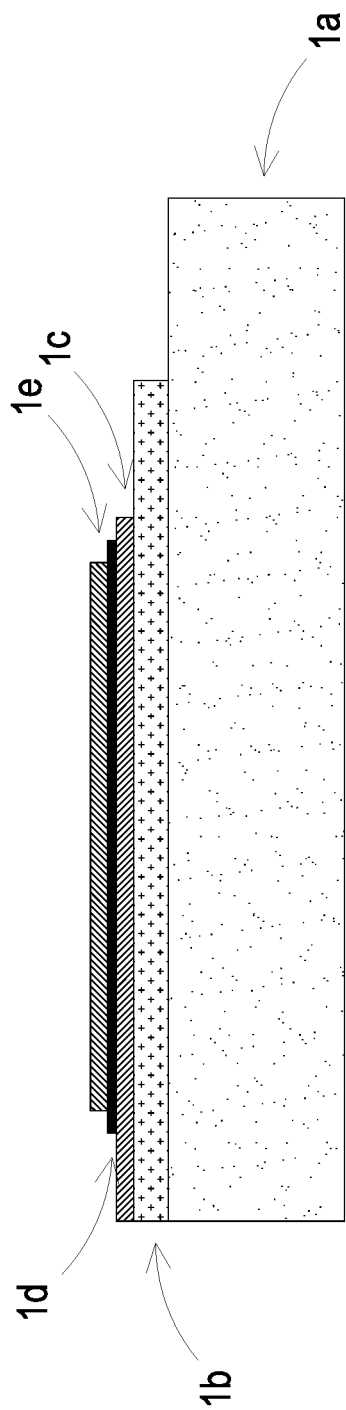
Figure 2C:
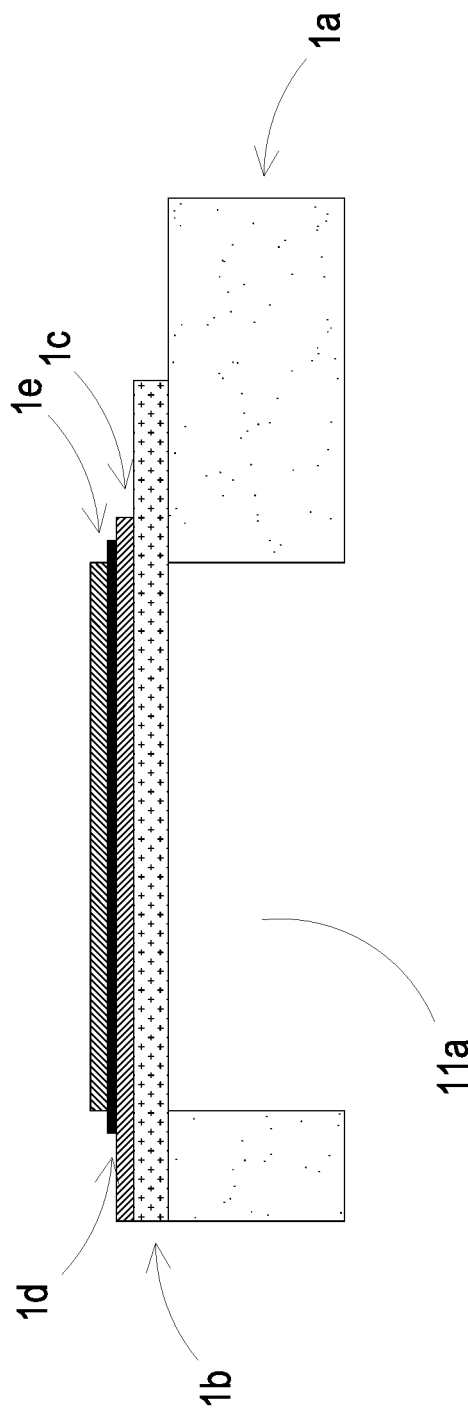
Figure 3A:
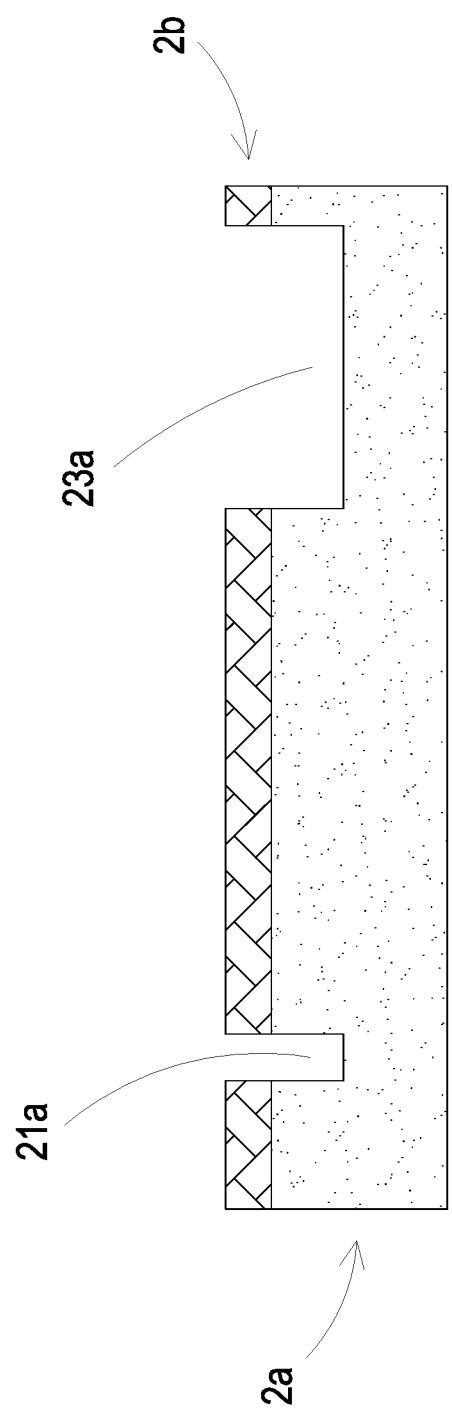
Figure 3B:
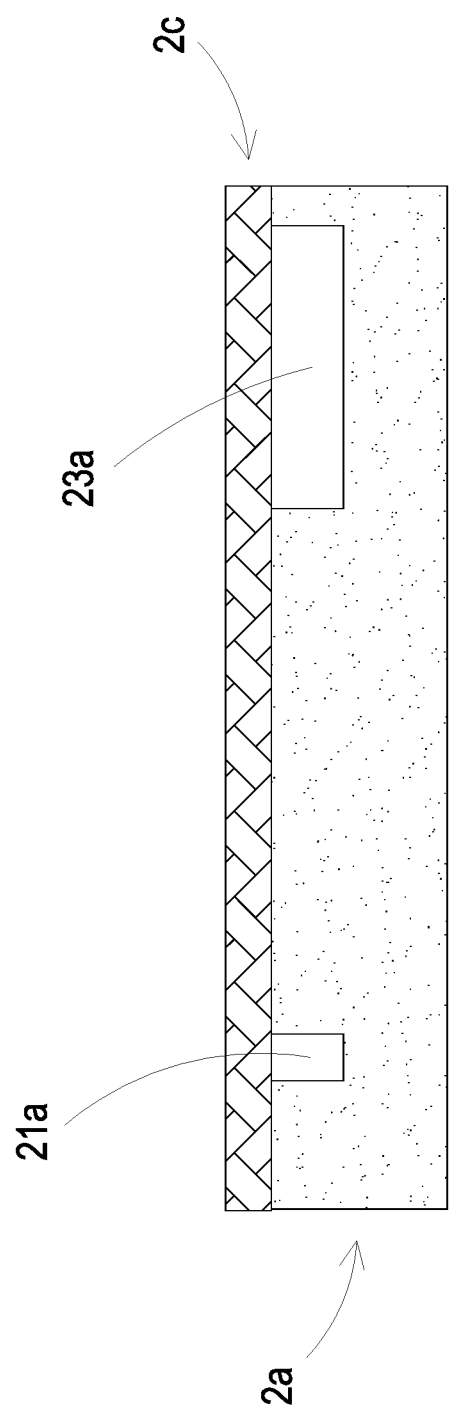
Figure 3C:
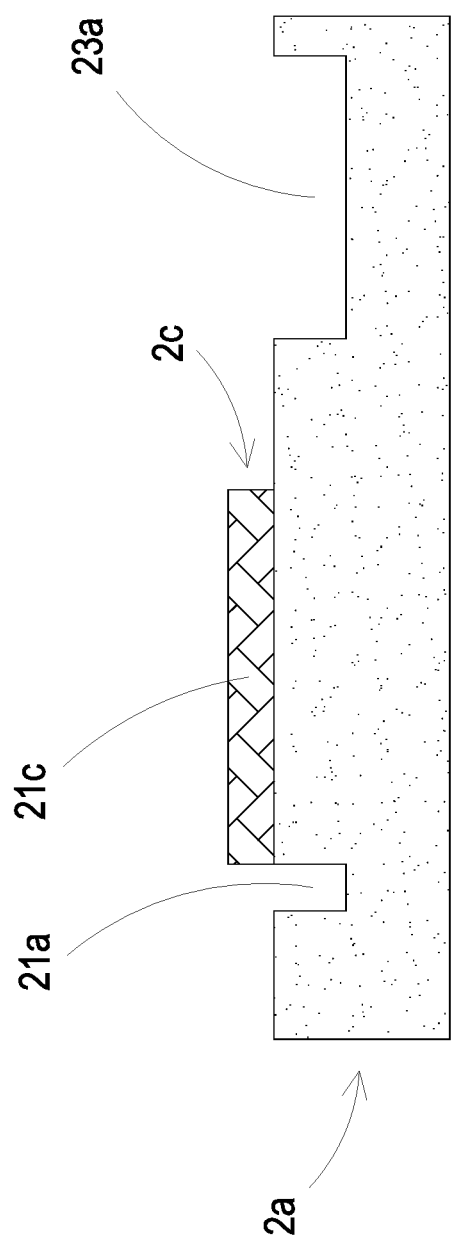
Figure 3D:
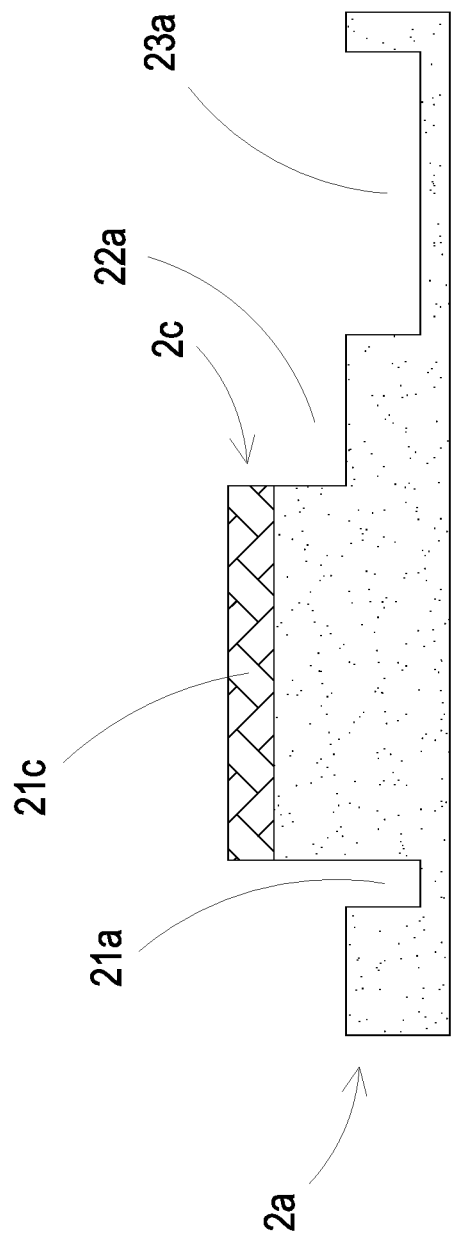
Figure 3F:
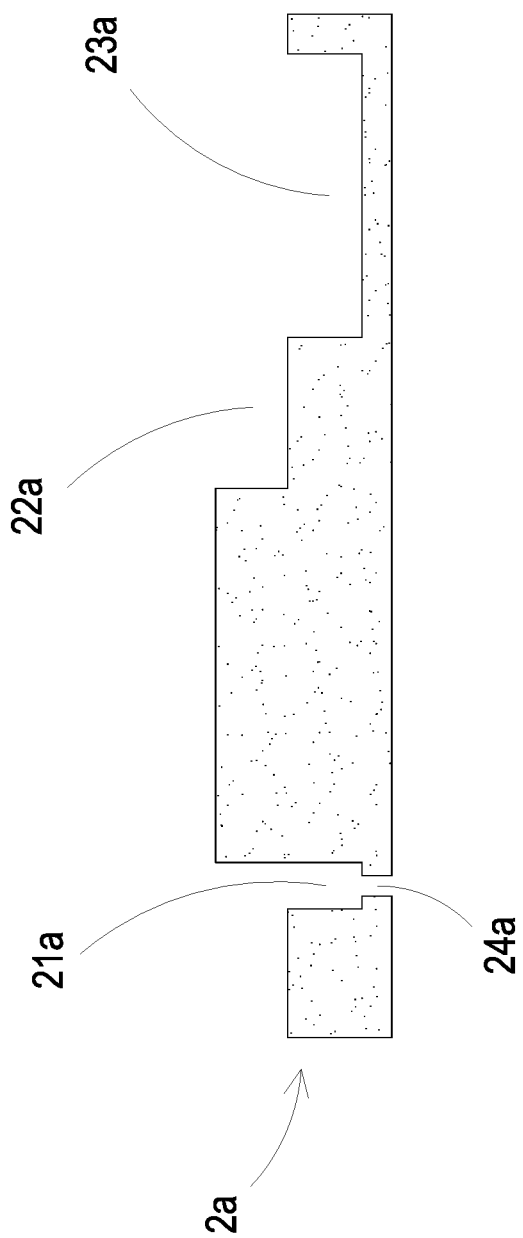

Please refer to FIG. 1. In the first embodiment, a heterogeneous integration chip 10 of a micro fluid actuator includes a first substrate 1a, a first insulation layer 1b, a first conductive layer 1c, a piezoelectric layer 1d, a second conductive layer 1e, a bonding layer 1f, a second substrate 2a, a control element 3, at least one perforated trench 4, at least one conductor 5 and a wiring body 6.

Notably, in the first embodiment, preferably but not exclusively, the heterogeneous integration chip 10 of the micro fluid actuator includes a protective layer 7 for protecting the second substrate 2a, the control element 3 and the wiring body 6, but not limited thereto. In other embodiments, the arrangement of the protective layer 7 can be adjusted according to design requirements. Moreover, in the first embodiment, the heterogeneous integration chip 10 of the micro fluid actuator further includes a valve layer 8. Preferably but not exclusively, the valve layer 8 has at least one valve region 8a, and an one-way valve is disposed in the valve region 8a to prevent backflow during fluid transportation, but not limited thereto. In other embodiments, the arrangements of the valve layer 8 and the valve region 8a can be adjusted according to design requirements.

It is also worth noted that in the first embodiment, the heterogeneous integration chip 10 of the micro fluid actuator includes one single actuation unit 9, but not limited thereto. In other embodiments, preferably but not exclusively, the heterogeneous integration chip 10 of the micro fluid actuator includes a plurality of actuation units 9 connected to each other in series, in parallel or in series and parallel.

Please refer to FIGS. 2A to 2D. The first substrate 1a includes at least one first chamber 11a. In the embodiment, the number of the first chamber 11a is exemplified by one, but not limited thereto. In the embodiment, an actuation region M is defined on the first conductive layer 1c, the piezoelectric layer 1d and the second conductive layer 1e by lithography and etching process. In the embodiment, the number of the actuation region M is exemplified by one, but not limited thereto. In the first embodiment, the first substrate 1a includes a first chamber 11a manufactured by lithography and etching process. Notably, in the first embodiment, preferably but not exclusively, the first substrate 1a is a silicon substrate. In other embodiments, the material of the first substrate 1a is adjustable according to design requirements. The first insulation layer 1b is disposed on the first substrate 1a. Notably, in the first embodiment, preferably but not exclusively, the first insulation layer 1b is made of a silicon nitride material. In other embodiments, the material of the first insulation layer 1b is adjustable according to design requirements. The first conductive layer 1c is disposed on the first insulation layer 1b, and includes at least one electrode pad (S', D', G'). In the first embodiment, preferably but not exclusively, the first conductive layer 1c includes three electrode pads (S', D', G'), but not limited thereto. Notably, in the first embodiment, the first conductive layer 1c is made of a conductive material, such as titanium/platinum (Ti/Pt), but not limited thereto. In other embodiments, the material of the first conductive layer 1c is adjustable according to design requirements. The piezoelectric layer 1d is disposed on the first conductive layer 1c. Notably, in the first embodiment, the piezoelectric layer 1d is made of a piezoelectric material, such as a film or a bulk of lead zirconate titanate. In other embodiments, the material of the piezoelectric layer 1d is adjustable according to design requirements. The second conductive layer 1e is disposed on the piezoelectric layer 1d. Notably, in the first embodiment, the second conductive layer 1e is made of a conductive material, such as titanium/aluminum (Ti/Al) or chrome/gold (Cr/Au), but not limited thereto. In other embodiments, the material of the second conductive layer 1e is adjustable according to design requirements. In the embodiment, the actuation region M is defined on the first conductive layer 1c, the piezoelectric layer 1d and the second conductive layer 1e by lithography and etching process. The actuation region M is corresponding to the first chamber 11a. The bonding layer 1f is disposed on a surface of the first substrate 1a opposed to the first insulation layer 1b. Notably, in the first embodiment, the bonding layer 1f is made of a dry film photoresist material, but not limited thereto. In other embodiments, the material of the bonding layer 1f is adjustable according to design requirements.

Please refer to FIGS. 3A to 3F. In the first embodiment, the second substrate 2a includes at least one fluid flowing channel 21a, at least one second chamber 22a, at least one third chamber 23a and at least one orifice 24a. Notably, the numbers of the at least one fluid flowing channel 21a, the at least one second chamber 22a, the at least one third chamber 23a and the at least one orifice 24a is exemplified by one for each respectively in the following embodiments, but not limited thereto. Certainly, the at least one fluid flowing channel 21a, the at least one second chamber 22a, the at least one third chamber 23a and the at least one orifice 24a can also be provided in plural numbers. In the first embodiment, the second substrate 2a includes a fluid flowing channel 21a, a second chamber 22a, a third chamber 23a and an orifice 24a. The fluid flowing channel 21a, the second chamber 22a and the third chamber 23a are formed by lithography and etching process. The orifice 24a is formed by laser etching. The fluid flowing channel 21a is in fluid communication between the orifice 24a and the first chamber 11a of the first substrate 1a. The second chamber 22a is in fluid communication between the third chamber 23a and the first chamber 11a of the first substrate 1a. Notably, in the first embodiment, preferably but not exclusively, the second substrate 2a is a silicon substrate. In other embodiments, the material of the second substrate 2a is adjustable according to design requirements. When the lithographic etching process is performed to produce the fluid flowing channel 21a and the third chamber 23a, a first mask layer 2b is disposed on the second substrate 2a firstly to define the etching positions. Notably, in the first embodiment, preferably but not exclusively, the first mask layer 2b is made of a dry film photoresist material. In other embodiments, the material of the first mask layer 2b is adjustable according to design requirements. When the photolithographic etching process is performed to manufacture the second chamber 22a, a second mask layer 2c is disposed on the second substrate 2a firstly to define the etching position. Preferably but not exclusively, the second mask layer 2c has a mask region 21c for defining the etching position. Notably, in the first embodiment, the second mask layer 2c is a dry film photoresist material, but not limited thereto. In other embodiments, the material of the second mask layer 2c is adjustable according to design requirements.

Figure 4:
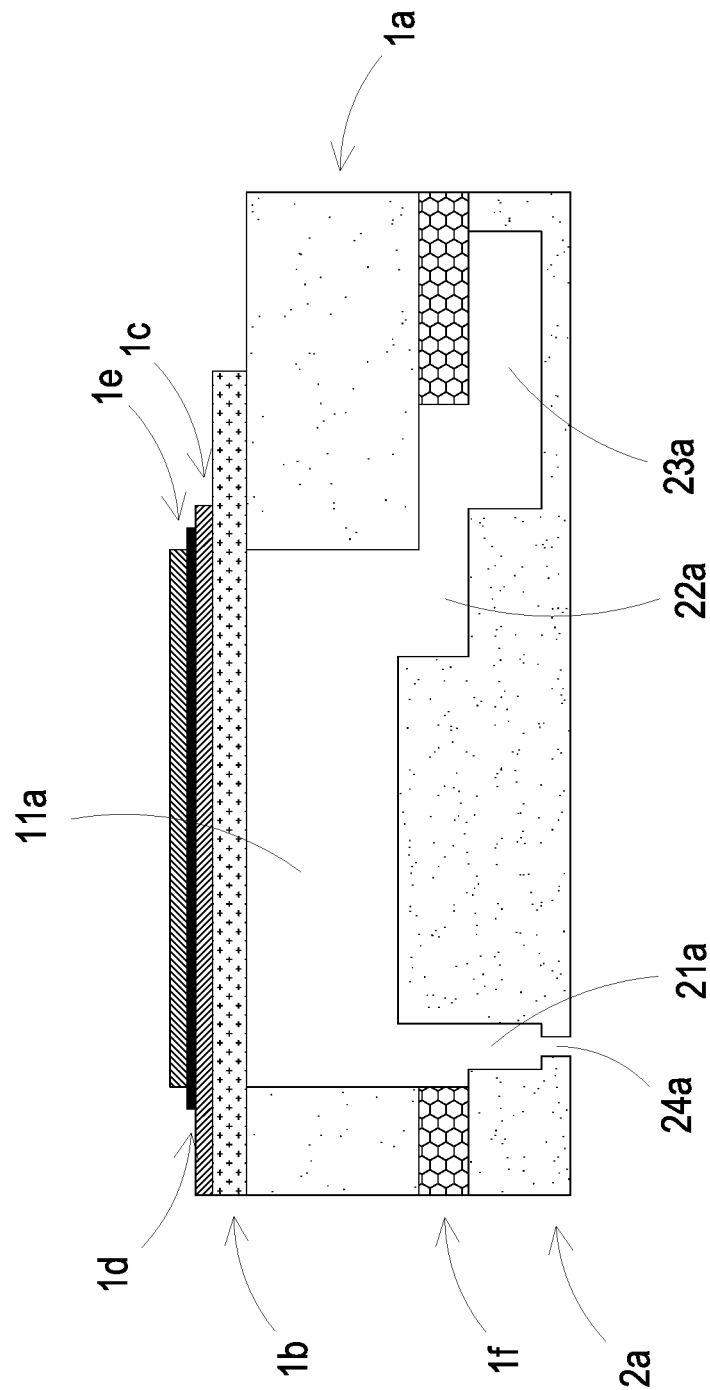
FIG. 4 is a cross sectional view illustrating the micro fluid actuator according to the first embodiment of the present disclosure.

Please refer to FIG. 4. In the first embodiment, the first substrate 1a and the second substrate 2a are assembled to each other through the bonding layer 1f.

Please refer to FIG. 1. In the first embodiment, the control element 3 is a metal-oxide-semiconductor field-effect transistor (MOSFET). The control element 3 is disposed in the second substrate 2a. The at least one perforated trench 4 is penetrated from the at least one electrode pad (S', D', G') to the second substrate 2a. In the first embodiment, preferably but not exclusively, the heterogeneous integration chip 10 of the micro fluid actuator includes three perforated trenches 4 corresponding to the number of the electrode pads (S', D', G'), but not limited thereto. The at least one conductor 5 is filled in the at least one perforated trench 4. In the first embodiment, preferably but not exclusively, the heterogeneous integration chip 10 of the micro fluid actuator includes three conductors 5 filled in the three perforated trenches 4, respectively. At least one wiring body 6 is electrically connected between the control element 3 and the at least one conductor 5. In the first embodiment, preferably but not exclusively, the heterogeneous integration chip 10 of the micro fluid actuator includes three wiring bodies 6 electrically connected between the control element 3 and the three conductors 5, respectively. Moreover, preferably but not exclusively, the wiring body 6 electrically connected between the control element 3 and the at least one conductor 5 on the second substrate 2a is disposed in the same plane. For the convenience of illustrating that the control element 3 and the wiring body 6 are electrically connected and the fluid flow of the orifice 24 is not affected by wiring body 6, a part of the wiring body 6 is indicated by a dotted line at the position of the orifice 24. In the first embodiment, preferably but not exclusively, the structures of the at least one perforated trench 4 and the at least one conductor 5 are manufactured by the through-silicon-via (TSV) technology, but not limited thereto. In the first embodiment, the protective layer 7 is used to protect the second substrate 2a, the control element 3 and the wiring body 6 and the fluid flow of the orifice 24a is not affected by the protective layer 7. A part of the protective layer 7 is indicated by a dotted line at the position of the orifice 24, but not limited thereto. In other embodiments, the arrangement of the protective layer 7 is adjustable according to design requirements, but not limited thereto. In the first embodiment, the valve layer 8 includes at least one valve region 8a, and a one-way valve is disposed in the valve region 8a to prevent backflow during fluid transportation. The fluid flow of the orifice 24a is not affected by the valve region 8a. A part of the valve region 8a is indicated by a dotted line at the position of the orifice 24, but not limited thereto. In other embodiments, the arrangement of the valve region 8a is adjustable according to design requirements, but not limited thereto.

Figure 5B:
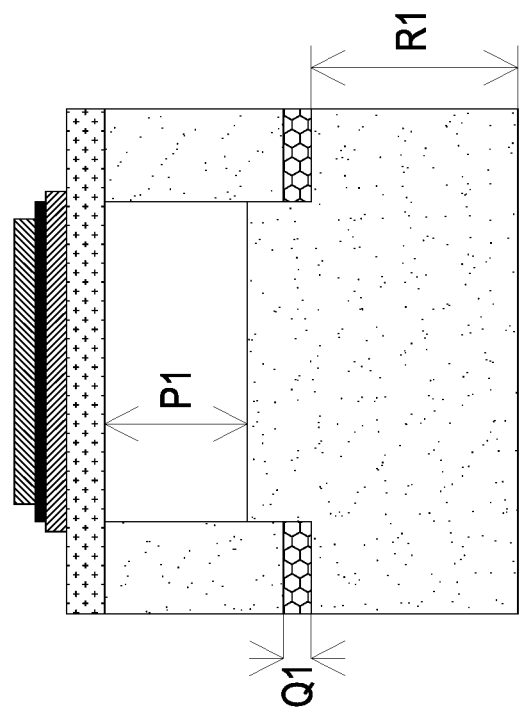
FIGS. 5A and 5B are cross sectional view illustrating the micro fluid actuator with different depth patterns.
Figure 5A:
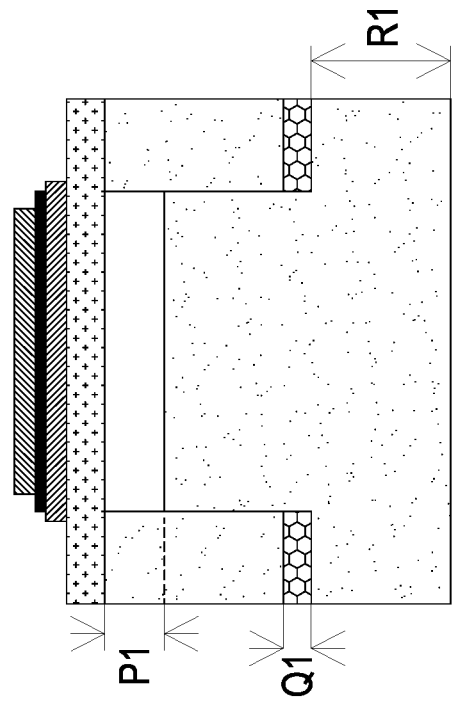

Please refer to FIG. 4 and FIGS. 5A and 5B. In the first embodiment, the first chamber 11a has a first depth (P1). Preferably but not exclusively, the first depth (P1) ranges from 50 μm to 200 μm and is adjustable according to design requirements. In the first embodiment, the bonding layer 1f has a second depth (Q1) of 14 μm, but not limited thereto. In other embodiments, preferably but not exclusively, the second depth (Q1) ranges from 10 μm to 35 μm and is adjustable according to design requirements. In the first embodiment, a third depth (R1) is defined from a bottom of the bonding layer 1f to a bottom of the second substrate 2a. Preferably but not exclusively, the third depth (R1) ranges from 370 μm to 525 μm, but not limited thereto. Notably, the first depth (P1), the second depth (Q1) and the third depth (R1) are adjustable according to design requirements. In order to comply with the characteristics of the fluid, since different fluids have different viscosities and compressibility, the first depth (P1) can be adjusted accordingly to improve the efficiency of fluid transportation.

Figure 6:
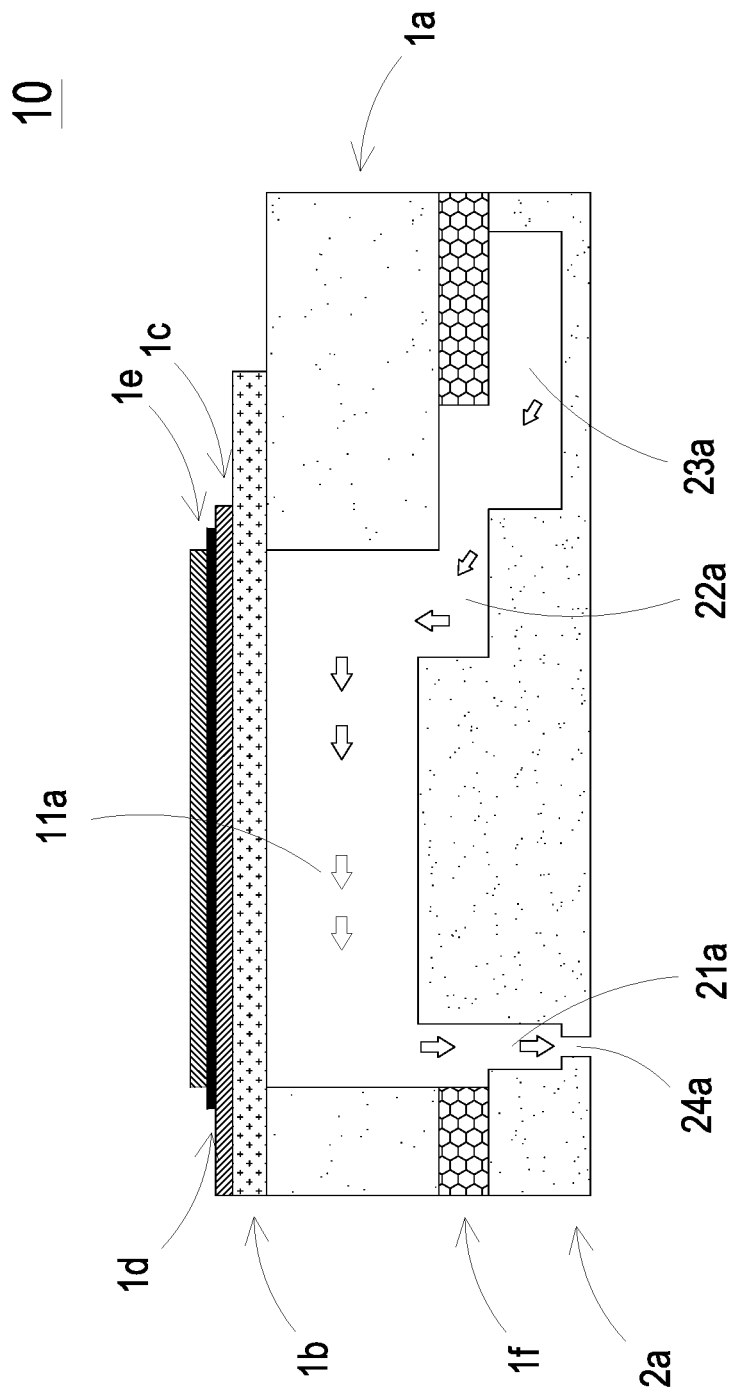
FIG. 6 is a cross sectional view illustrating a fluid flow of the micro fluid actuator according to the first embodiment of the present disclosure.

Please refer to FIG. 6. In the first embodiment, when the heterogeneous integration chip 10 of the micro fluid actuator is actuated, the fluid flows from the third chamber 23a through the second chamber 22a and converges to the first chamber 11a. Then, the fluid flows from the first chamber 11a to the orifice 24a through the fluid flowing channel 21a. After that, the fluid is discharged out of the heterogeneous integration chip 10 of the micro fluid actuator through the orifice 24a.

Figure 7:
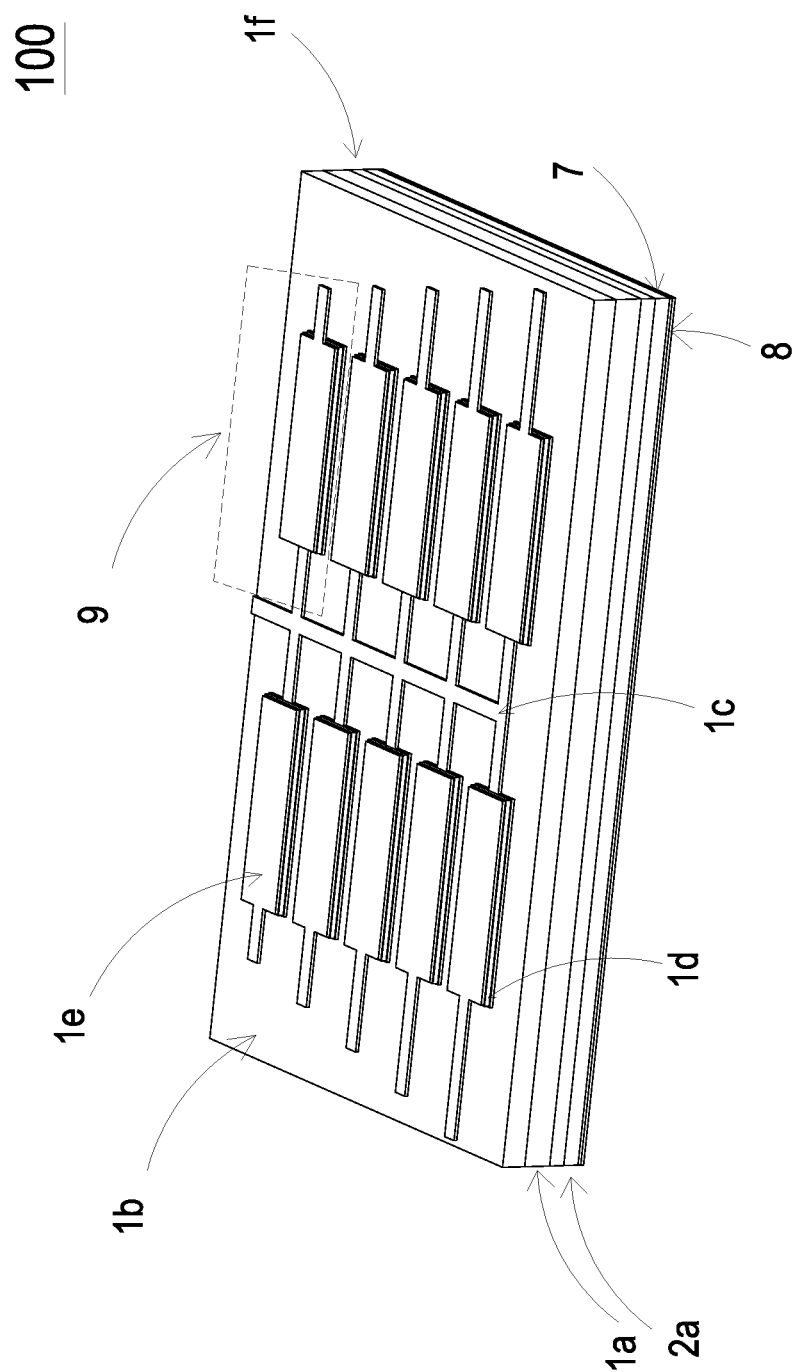
FIG. 7 is a perspective view illustrating a part of a heterogeneous integration chip of a micro fluid actuator according to a second embodiment of the present disclosure and taken from the top side perspective.
Figure 8:
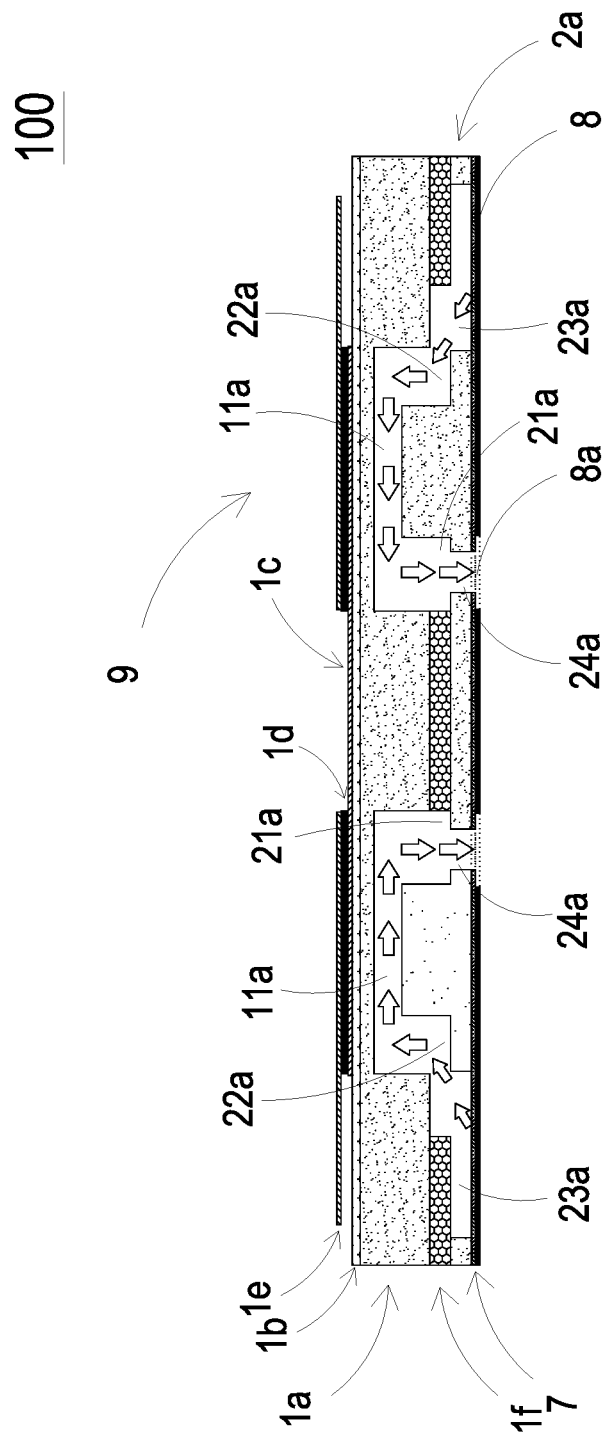
FIG. 8 is a cross sectional view illustrating a fluid flow of the micro fluid actuator according to the second embodiment of the present disclosure.

Please refer to FIGS. 7 and 8. In the second embodiment, the heterogeneous integration chip 100 of the micro fluid actuator is similar to the heterogeneous integration chip 10 of the micro fluid actuator in the first embodiment. The difference from the heterogeneous integration chip 10 of the micro fluid actuator in the first embodiment resides in that the heterogeneous integration chip 100 of the micro fluid actuator includes a plurality of actuation units 9. In the second embodiment, preferably but not exclusively, the actuation units 9 are connected to each other in series and parallel. When the heterogeneous integration chip 100 of the micro fluid actuator is actuated, the fluid is converged from the third chamber 23a through the second chamber 22a to the first chamber 11a of each actuation unit 9. Then, the fluid flows from the first chamber 11a through the fluid flowing channel 21a to the orifice 24a of each actuation unit 9, so that the fluid is discharged out of the heterogeneous integration chip 100 of the micro fluid actuator through the orifice 24a of each actuation unit 9. In the second embodiment, the fluid flow of each orifice 24a is not affected by the protective layer 7. A part of the protective layer 7 is indicated by a dotted line at the position of the orifice 24, but not limited thereto. In other embodiments, the arrangement of the protective layer 7 is adjustable according to design requirements, but not limited thereto. In the second embodiment, the valve layer 8 includes at least two valve regions 8a, and a one-way valve is disposed in each valve region 8a to prevent backflow during fluid transportation. The fluid flow of each orifice 24a is not affected by the valve regions 8a. A part of the valve region 8a is indicated by a dotted line at the position of the orifice 24, but not limited thereto. In other embodiments, the arrangements of the valve regions 8a are adjustable according to design requirements, but not limited thereto.

Figure 9:
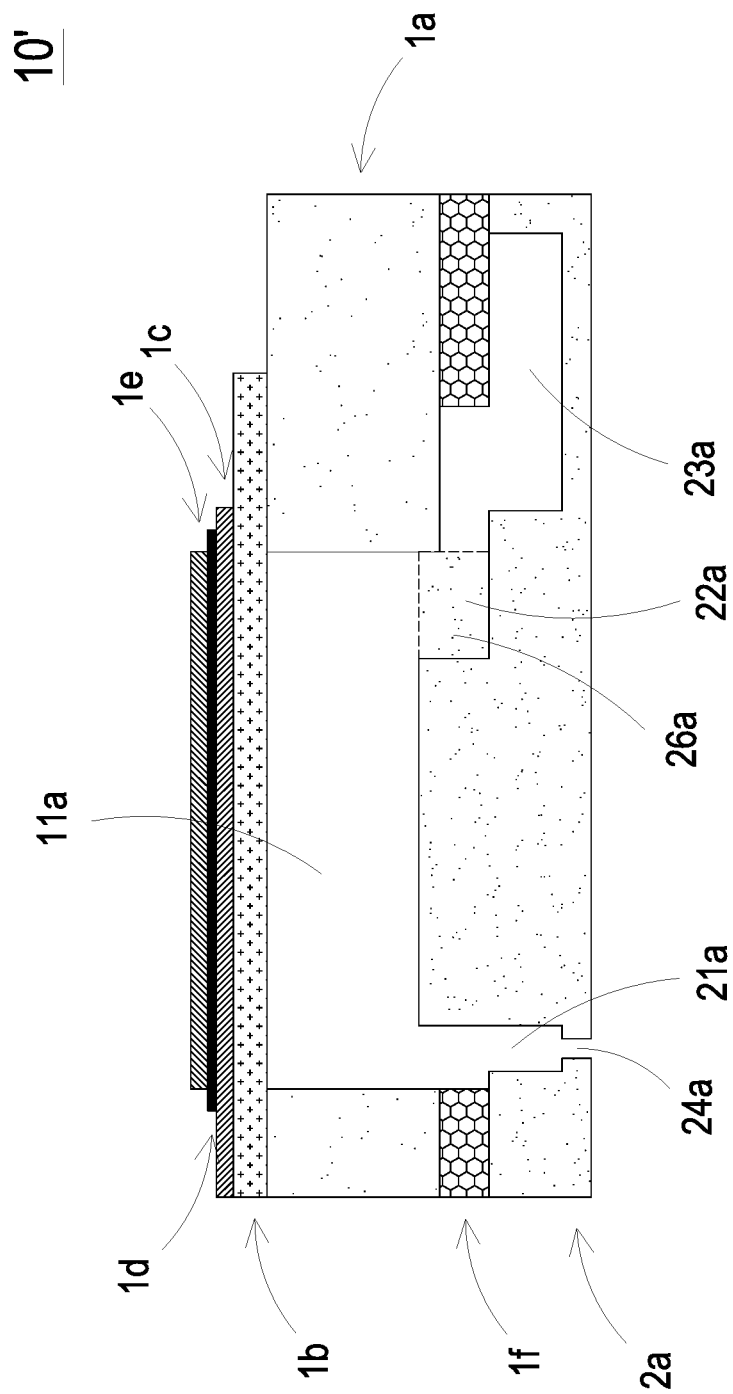
FIG. 9 is a cross sectional view illustrating a heterogeneous integration chip of a micro fluid actuator according to a third embodiment of the present disclosure.

Please refer to FIG. 9. In the third embodiment, the heterogeneous integration chip 10' of the micro fluid actuator is similar to the heterogeneous integration chip 10 of the micro fluid actuator in the first embodiment. The difference from the heterogeneous integration chip 10 of the micro fluid actuator in the first embodiment resides in that the heterogeneous integration chip 10' of the micro fluid actuator further includes a filter structure 26a disposed in the second chamber 22a of the second substrate 2a for filtering the fluid.

Figure 10A:
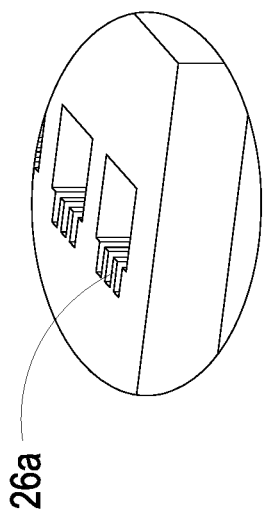
FIGS. 10A to 10C are partial perspective view illustrating filter structures with in different configuration in the third embodiment of the present disclosure.
Figure 10C:
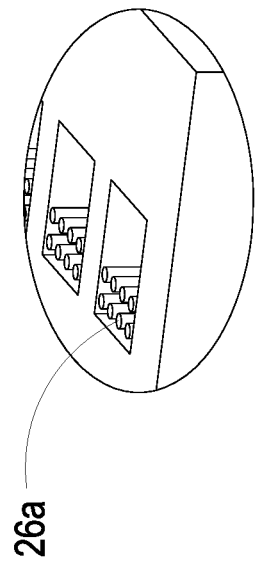
Figure 10B:
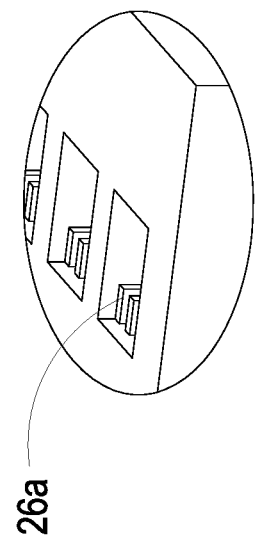

Please refer to FIGS. 10A to 10C. In the third embodiment, the filter structure 26a has different structure. Preferably but not exclusively, the shape of the filtering structure 26a can be a guide groove, as shown in FIG. 10A, a square column, as shown in FIG. 10B, and a cylindrical, as shown in FIG. 10C, but not limited thereto. In other embodiments, the filter structure 26a is adjustable according to design requirements.

Figure 11:
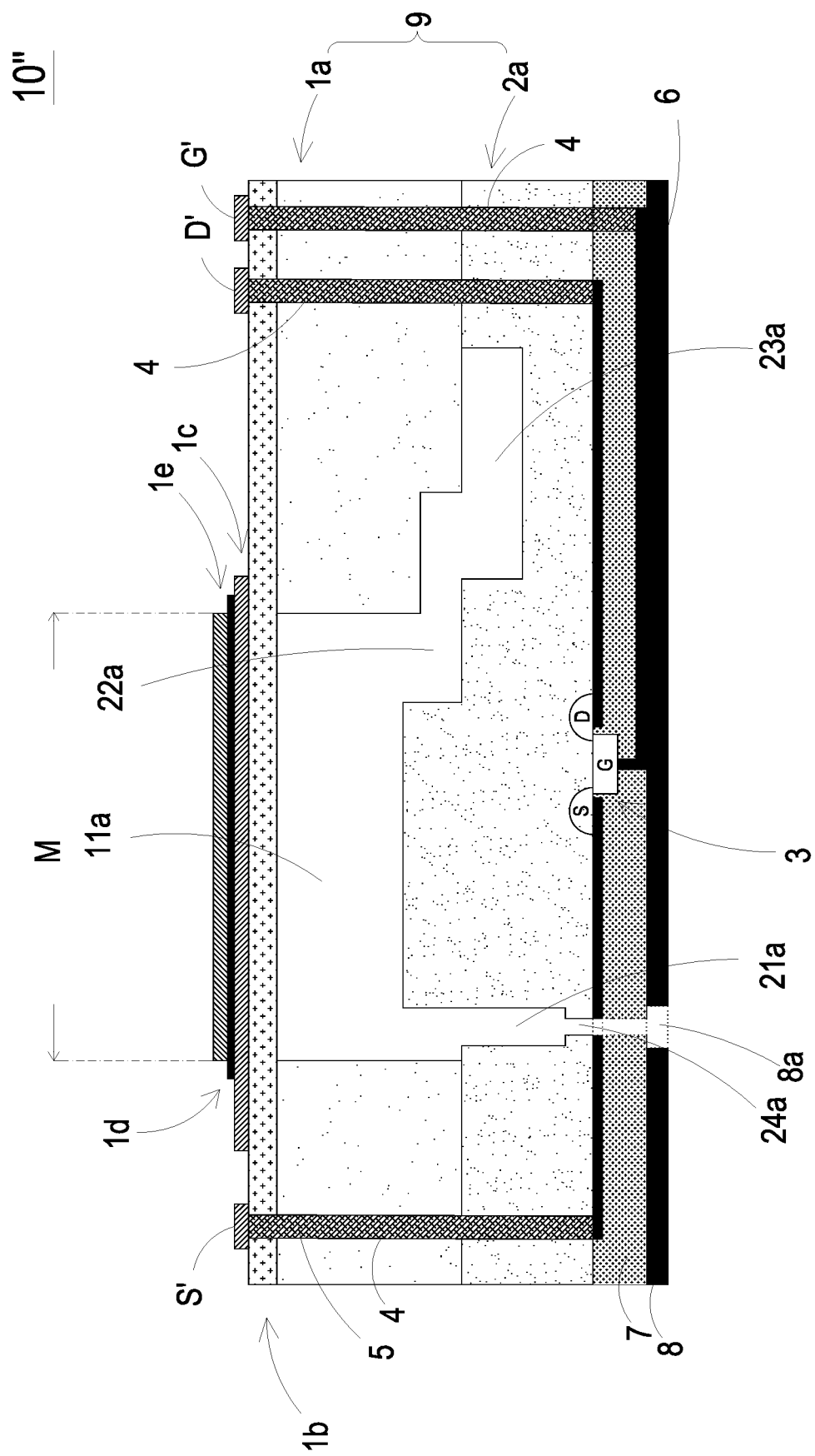
FIG. 11 is a cross sectional view illustrating a heterogeneous integration chip of a micro fluid actuator according to a fourth embodiment of the present disclosure.

Please refer to FIG. 11. In the fourth embodiment, the heterogeneous integration chip 10" of the micro fluid actuator is similar to the heterogeneous integration chip 10 of the micro fluid actuator in the first embodiment. The difference from the heterogeneous integration chip 10 of the micro fluid actuator in the first embodiment resides in that the heterogeneous integration chip 10" of the micro fluid actuator omits the bonding layer 1f. In the fourth embodiment, the first substrate 1a and the second substrate 2a are assembled with each other by a mortise-and-tenon joint method. Notably, in the fourth embodiment, the mortise-and-tenon joint method is a self-aligned joint, which is different from the conventional bonding method that requires positioning points to be aligned. That is, the first substrate 1a and the second substrate 2a are self-aligned and bonded to each other. In the fourth embodiment, the fluid flow of the orifice 24a is not affected by the protective layer 7. A part of the protective layer 7 is indicated by a dotted line at the position of the orifice 24, but not limited thereto. In other embodiments, the arrangement of the protective layer 7 is adjustable according to design requirements, but not limited thereto. In the fourth embodiment, the valve layer 8 includes at least one valve region 8a, and a one-way valve is disposed in the valve region 8a to prevent backflow during fluid transportation. The fluid flow of the orifice 24a is not affected by the valve regions 8a. A part of the valve region 8a is indicated by a dotted line at the position of the orifice 24, but not limited thereto. In other embodiments, the arrangement of the valve region 8a is adjustable according to design requirements, but not limited thereto.

Figure 12A:
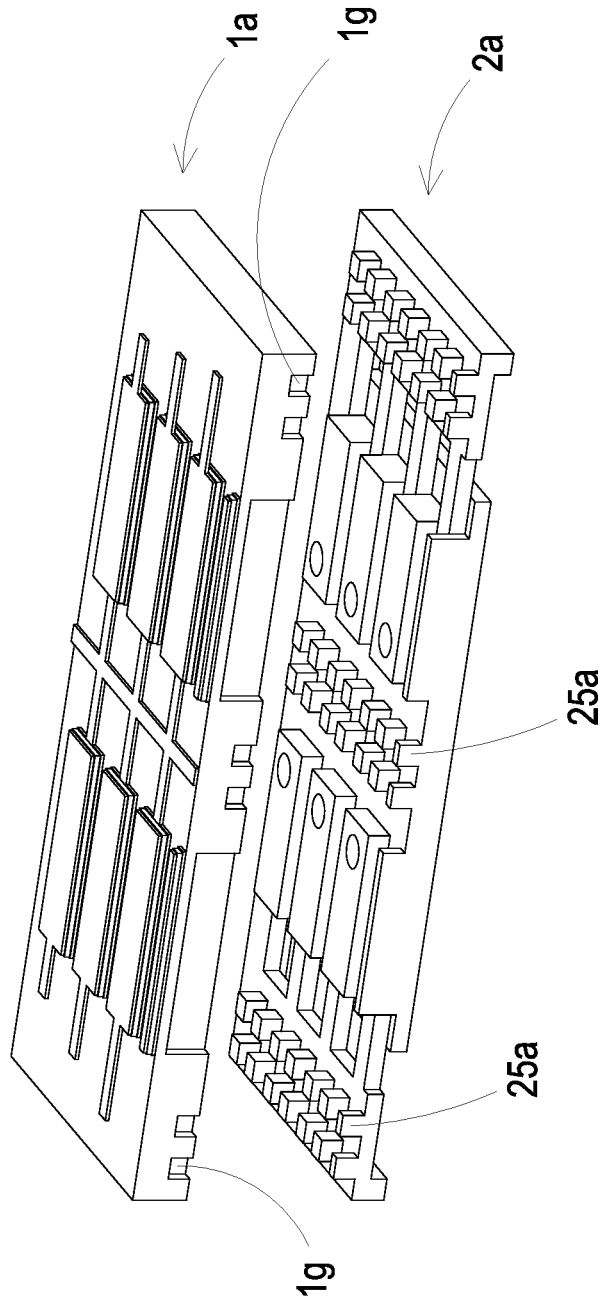
FIGS. 12A to 12C are partial perspective exploded views illustrating different bonding structure of the micro fluid actuator in the fourth embodiment.
Figure 12B:
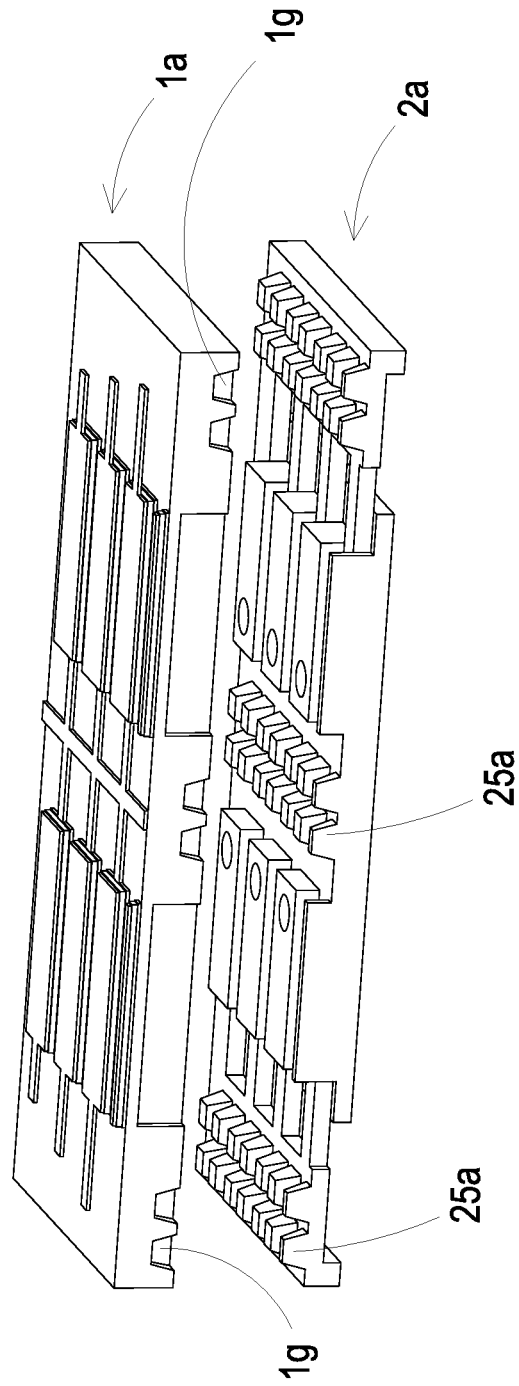
Figure 12C:
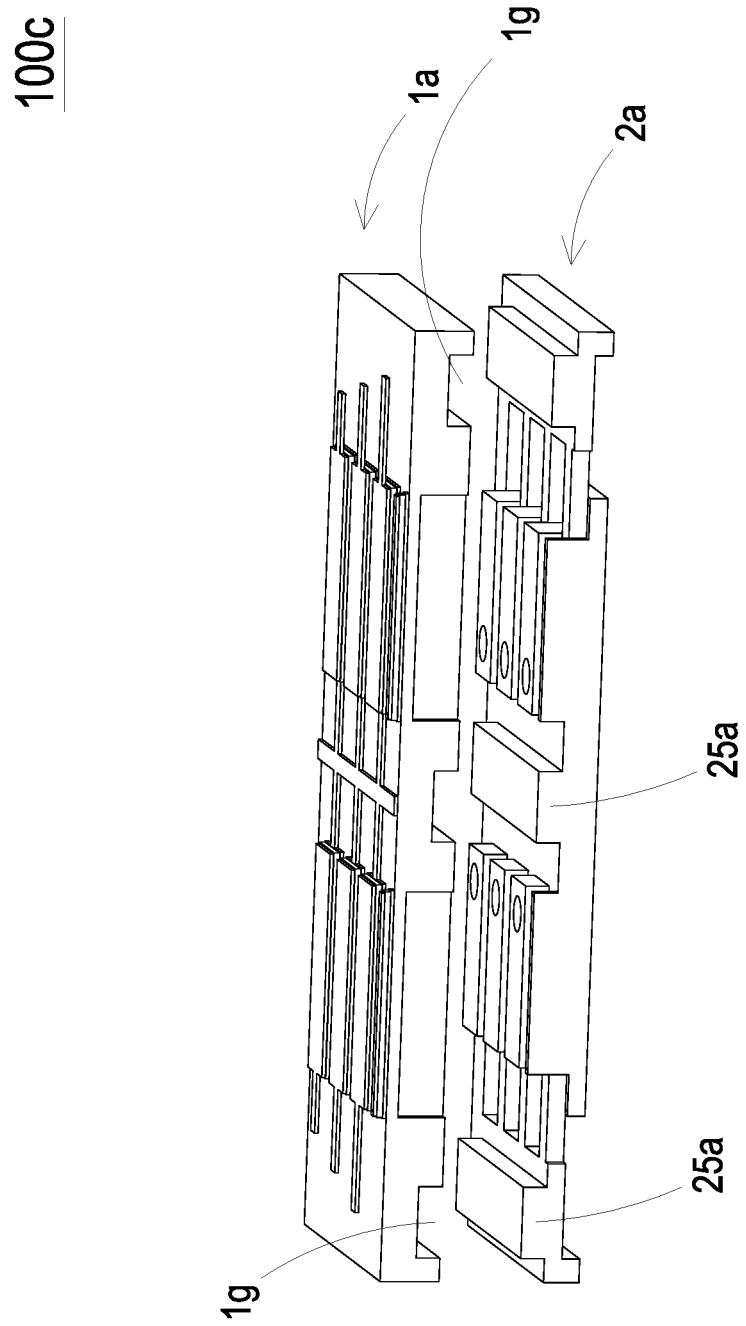

Please refer to FIGS. 12A to 12C. In the fourth embodiment, the first substrate 1a includes at least one engaging recess 1g, and the second substrate 2a includes at least one engaging protrusion 25a. The engaging recess 1g and the engaging protrusion 25a are corresponding in shape to each other; therefore, the first substrate 1a and the second substrate 2a are assembled with each other by the mortise-and-tenon joint method. In the fourth embodiment, the engaging protrusion 25a has different structure. Preferably but not exclusively, the shape of the engaging protrusion 25a is a cube, as shown in FIG. 12A. Preferably but not exclusively, the shape of the engaging protrusion 25a is a cuboid, as shown in FIG. 12B. Preferably but not exclusively, the shape of the engaging protrusion 25a is a quadrilateral, as shown in FIG. 12C. The present disclosure is not limited thereto. In other embodiments, the shapes of the engaging recess 1g and the engaging protrusion 25a are adjustable according to design requirements.

In summary, the present disclosure provides a heterogeneous integration chip of a micro fluid actuator, which is manufactured by a micro-electromechanical semiconductor process with the support of TSV packaging technology. The micro fluid actuator and the control element are arranged on two opposed sides. In addition, the integration chip of the micro fluid actuator is controlled to achieve the purpose of fluid transportation.

While the disclosure has been described in terms of what is presently considered to be the most practical and preferred embodiments, it is to be understood that the disclosure needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A heterogeneous integration chip of a micro fluid actuator, comprising:
    a first substrate comprising a first chamber;
    a first insulation layer disposed on the first substrate;
    a first conductive layer disposed on the first insulation layer and comprising at least one electrode pad;
    a piezoelectric layer disposed on the first conductive layer;
    a second conductive layer disposed on the piezoelectric layer;
    a second substrate assembled to the first substrate to define a second chamber and comprising an orifice, a fluid flowing channel and a third chamber;
    a bonding layer connected between the first substrate and the second substrate;
    a control element disposed in the second substrate;
    at least one perforated trench penetrated from the at least one electrode pad to the second substrate; and
    at least one conductor filled in the at least one perforated trench.

2. The heterogeneous integration chip of the micro fluid actuator according to claim 1, wherein the first substrate and the second substrate are silicon substrates.

3. The heterogeneous integration chip of the micro fluid actuator according to claim 1, wherein the first insulation layer is made of a silicon nitride material.

4. The heterogeneous integration chip of the micro fluid actuator according to claim 1, wherein the control element is a metal-oxide-semiconductor field-effect transistor.

5. The heterogeneous integration chip of the micro fluid actuator according to claim 1, further comprising at least one wiring body electrically connected between the control element and the at least one conductor.

6. The heterogeneous integration chip of the micro fluid actuator according to claim 1, wherein the first chamber has a first depth ranging from 50 μm to 200 μm.

7. The heterogeneous integration chip of the micro fluid actuator according to claim 1, wherein the bonding layer has a second depth ranging from 10 μm to 35 μm.

8. The heterogeneous integration chip of the micro fluid actuator according to claim 1, wherein a third depth defined from a bottom of the bonding layer to a bottom of the second substrate ranges from 370 μm to 525 μm.

9. The heterogeneous integration chip of the micro fluid actuator according to claim 1, wherein the second substrate comprises at least one engaging protrusion.

10. The heterogeneous integration chip of the micro fluid actuator according to claim 9, wherein the shape of the at least one engaging protrusion is selected from the group consisting of a cube, a cuboid and a quadrilateral.

11. The heterogeneous integration chip of the micro fluid actuator according to claim 10, wherein the first substrate comprises at least one engaging recess, and the shape of the at least one engaging recess is corresponding to the at least one engaging protrusion of the second substrate.

12. The heterogeneous integration chip of the micro fluid actuator according to claim 1, further comprising a filter structure disposed in the second chamber.

13. The heterogeneous integration chip of the micro fluid actuator according to claim 12, wherein the shape of the filter structure is selected from the group consisting of a guide groove, a square column and a cylindrical.

14. A heterogeneous integration chip of a micro fluid actuator, comprising:
    a first substrate comprising at least one first chamber;
    a first insulation layer disposed on the first substrate;
    a first conductive layer disposed on the first insulation layer and comprising at least one electrode pad;
    a piezoelectric layer disposed on the first conductive layer;
    a second conductive layer disposed on the piezoelectric layer, wherein at least one actuation region is collaboratively defined by the first conductive layer, the piezoelectric layer and the second conductive layer;

a second substrate assembled to the first substrate to define at least one second chamber and comprising at least one orifice, at least one fluid flowing channel and at least one third chamber, wherein the positions of the at least one first chamber of the first substrate, the at least one second chamber of the second substrate, the at least one orifice, the at least one fluid flowing channel and the at least one third chamber are corresponding to the at least one actuation region;

a control element disposed in the second substrate;

at least one perforated trench penetrated from the at least one electrode pad to the second substrate; and at least one conductor filled in the at least one perforated trench.

\* \* \* \* \*